United States Patent [19]
Falster et al.

[11] Patent Number: 5,403,406
[45] Date of Patent: Apr. 4, 1995

[54] SILICON WAFERS HAVING CONTROLLED PRECIPITATION DISTRIBUTION

[75] Inventors: Robert Falster, Milan; Giancarlo Ferrero, Novara; Graham Fisher, Novara; Massimiliano Olmo, Novara; Marco Pagani, Novara, all of Italy

[73] Assignee: MEMC Electronic Materials, SpA, Novara, Italy

[21] Appl. No.: 64,013

[22] PCT Filed: Nov. 11, 1991

[86] PCT No.: PCT/IT91/00095
§ 371 Date: May 13, 1993
§ 102(e) Date: May 13, 1993

[87] PCT Pub. No.: WO92/09101
PCT Pub. Date: May 29, 1992

[30] Foreign Application Priority Data

Nov. 15, 1990 [IT] Italy .................................. 48481/90

[51] Int. Cl.⁶ .......................................... H01L 21/324
[52] U.S. Cl. ....................................... 148/33.2; 148/33; 437/10; 437/12; 437/248; 117/2
[58] Field of Search ................... 437/10, 12, 174, 248; 148/33, 33.2, DIG. 24, DIG. 60, DIG. 71; 117/20

[56] References Cited

U.S. PATENT DOCUMENTS

| | | | |
|---|---|---|---|
| 4,376,657 | 3/1983 | Nagasawa et al. | 148/1.5 |
| 4,401,506 | 8/1983 | Otsuka | 156/612 |
| 4,548,654 | 10/1985 | Tobin | 148/1.5 |
| 4,622,082 | 11/1986 | Dyson et al. | 148/33 |
| 4,661,166 | 3/1987 | Hirao | 148/1.5 |
| 4,851,358 | 7/1989 | Huber | 437/10 |
| 4,868,133 | 9/1989 | Huber | 437/10 |
| 5,096,839 | 3/1992 | Amai et al. | 437/10 |
| 5,228,927 | 7/1993 | Kitagawara et al. | 148/33.2 |

FOREIGN PATENT DOCUMENTS 0066451 12/1982 European Pat. Off. .
56-158431 12/1981 Japan .
60-239030 11/1985 Japan .

OTHER PUBLICATIONS

Nauka, N., Appl. Phys. Lett 46(7), 1 Apr. 1985, pp. 673–675.
Wisaranakula, W., J. Mater. Res. 1 (5), Sep./Oct. 1986, pp. 693–697.
Tan, T. Y., J. Appl. Phys. 59(3), 1 Feb. 1986, pp. 917–931.
Remram, M., Mat. Res. Soc. Symp. Proc., vol. 74, 1987, pp. 705–710.
Swaroop, "Advances in Silicon Technology for the Semiconductor Industry" Solid State Technology, vol. 26, No. 7, Jul. 7, 1983, pp. 97–101.
Hawkins et al., "The Effect of Rapid Thermal Annealing On The Precipitation of Oxygen in Silicon" Journal of Applied Physics, vol. 65, No. 9, May 1, 1989, pp. 3644–3654.

Primary Examiner—Olik Chaudhuri
Assistant Examiner—Ken Horton
Attorney, Agent, or Firm—Senniger, Powers, Leavitt & Roedel

[57] ABSTRACT

A silicon wafer containing oxygen precipitate nucleation centers (or oxygen precipitates) and having a first face, a second face, and a central plane equidistant between the first and second faces. The nucleation centers (or oxygen precipitates) have a non-uniform distribution between the first and second faces with a maximum density of the nucleation centers (or oxygen precipitates) being in a region which is between the first face and the central plane and nearer to the first face than the central plane. The density of the nucleation centers (or oxygen precipitates) increases from the first face to the region of maximum density and decreasing from the region of maximum density to the central plane.

6 Claims, 3 Drawing Sheets

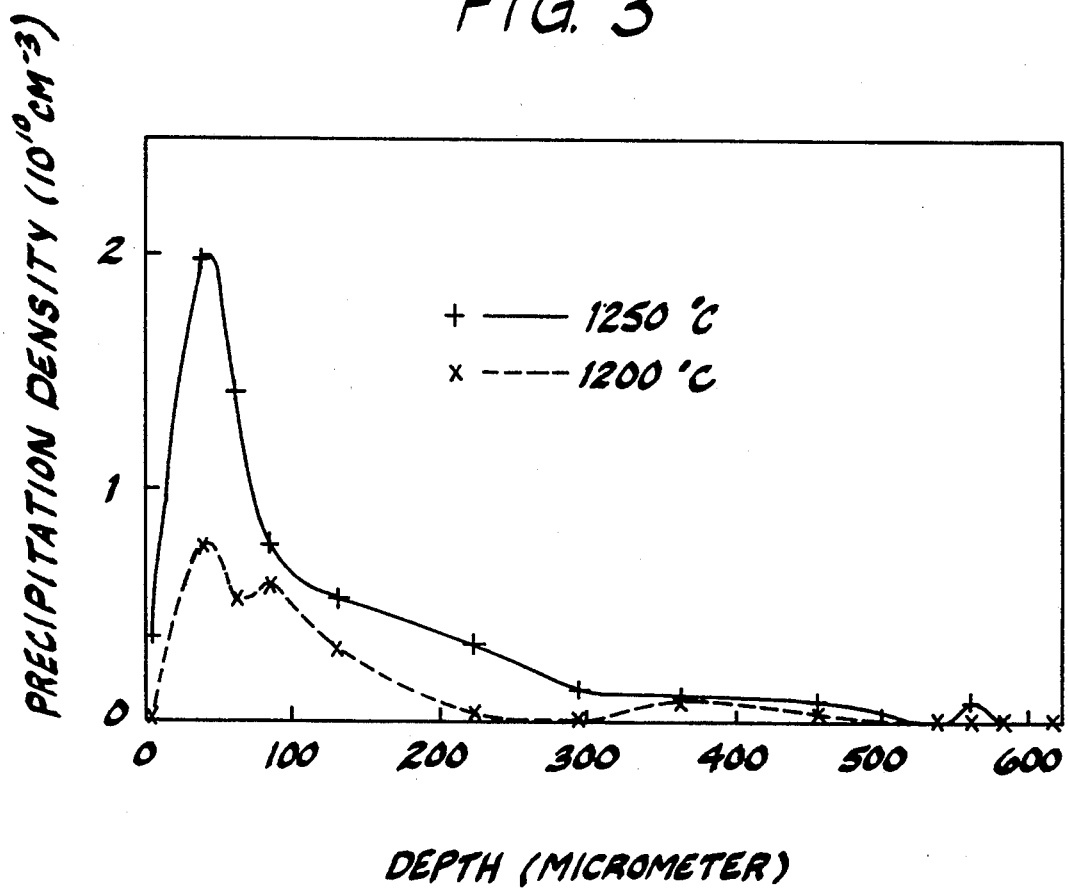

SILICON WAFERS HAVING CONTROLLED PRECIPITATION DISTRIBUTION

BACKGROUND OF THE INVENTION

The present invention generally relates to the processes for the fabrication of semiconductor material substrates, especially the so-called silicon "slices" or wafers, for the manufacture of electronic components. More particularly, the present invention relates to a process for the treatment of silicon wafers under conditions suitable for the control of the concentration and of the distribution profile of the "gettering" or internal trapping sites.

As is known, single crystal silicon, which is the starting material for most processes for the fabrication of semiconductor electronic components, is commonly prepared with the so-called Czochralski process wherein a single seed crystal is immersed into molten silicon and then grown by slow extraction. As molten silicon is contained in a quartz crucible, it is contaminated with various impurities, among which mainly oxygen. At the temperature of the silicon molten mass, oxygen comes into the crystal lattice until it reaches a concentration determined by the solubility of oxygen in silicon at the temperature of the molten mass and by the actual segregation coefficient of oxygen in solidified silicon. Such concentrations are greater than the solubility of oxygen in solid silicon at the temperatures typical for the processes for the fabrication of integrated circuits. Therefore, as the crystal grows from the molten mass and cools, the solubility of oxygen in it decreases rapidly, whereby in the resulting slices of wafers, oxygen is present in supersaturated concentrations. As it is in supersaturated concentrations, the subsequent thermal treatment cycles of the wafers cause the precipitation of oxygen.

The precipitation of oxygen can cause useful effects and harmful effects. The useful effects are connected with the capability of oxygen precipitates (and of the "defects" connected thereto) to trap the undesired metal impurities that could subsequently come into contact with the wafer during the subsequent manufacture for the fabrication of the electronic component and compromise the performance of the latter. The harmful effects derive from the fact that such precipitates themselves will be contamination agents if they are situated in the active region of the wafer, where, on the contrary, a very high purity for the fabrication e.g. of an integrated circuit is necessary.

Over the years, various schemes have been suggested for carrying out the treatment of silicon wafers in such a manner that the active region, which occupies a depth of a few microns from the surface of the wafer, is comparatively devoid of the aforementioned "defects", whereas the remaining thickness of the wafer has a density of such defects sufficiently high for an effective trapping of the undesired metal impurities.

Such techniques are known as trapping or "intrinsic" gettering techniques and the region devoid of defects close to the surface of the wafer is named the denuded zone.

SUMMARY OF THE INVENTION

The object of the present invention is to indicate a process for controlling the concentration of the trapping centres present in silicon wafers and, more particularly, for realizing the defect density profile necessary to achieve a good denuded zone and a good intrinsic trapping effect.

In more precise terms, a first aspect of the invention relates to the control of the level of precipitation of oxygen in silicon wafers. A second aspect relates to the control of the density profiled of oxygen precipitates, in such a manner that the peak of the profile can act as a trapping region distinct and far from the active region of the device. A third aspect relates, therefore, to the fabrication of controlled precipitation wafers having an effective denuded zone in correspondence with the active region of the device and a highly effective trapping zone in the remaining volume.

These objects are achieved according to the present invention by means of a process for the treatment of silicon slices or wafers intended for use in the fabrication of integrated circuit electronic components. The process comprises the following fundamental operations: (a) subjecting the wafers to a preliminary thermal treatment, at a temperature between 950° C. and 1150° C., in particular at about 1100° C., for a duration of about 15 minutes; (b) after a standard chemical corrosion (etching) treatment, subjecting pairs of wafers coupled in a close reciprocal thermal contact to a fast thermal annealing treatment, at a temperature between 1200° C. and 1275° C. for a duration of some tens of seconds; (c) subjecting the wafers to a further extended thermal treatment at a temperature between 900° C. and 1000° C., and, finally, (d) extracting the wafers from the furnace and subjecting the surfaces that were in close reciprocal contact during the fast annealing treatment to a surface polishing. For the coupling of the two slices it suffices to realize a mechanical-thermal contact between the two surfaces: other methodologies for coupling more intimately that realize atomic bonds between the two surfaces (wafer-bonding) aren't necessary, but can be used.

As will be better explained in the following, the treatment according to the invention initially produces high temperature nucleation centres, named the "precursors" during the thermal fast annealing operation and these precursors subsequently give rise to the classic "defects".

Although prior publications, such as "Advances in Silicon Technology for the Semiconductor Industry" in 400 Solid State Technology, Vol. 26, 1983) July, No. 7, Port Washington, New York, USA, report the generation of these precursors, considerable differences exist with respect to the work performed in the frame of the present invention. First of all, the generation time scales have shown themselves to be very faster than those previously recognized. Secondly, a lower bound has been recognized only of about 1200° C. for the high temperature treatment. Thirdly, no need has been found for a treatment at a comparatively low temperature and, about 650° C., to obtain the formation of a convenient defect density profile.

Finally, by virtue of the coupling of two wafers during the high temperature fast annealing treatment, in each wafer a completely unsymmetrical profile has been realized which sees a very high defect density by the one side and a very low defect density by the other side, achieved only by exploiting the observation that the modality of the cooling of the wafer plays an important role in the formation of the density profile.

In addition, no mention is made in such prior publication that argon and nitrogen atmospheres during the heat treatment may have different effects upon the precipitate density profiles.

In particular, therefore, the present invention is directed to a silicon wafer containing oxygen precipitate nucleation centers. The silicon wafer has a first face, a second face and a central plane equidistant between the first and second faces. The maximum density of the nucleation centers is in a region which is between the first face and the central plane and nearer to the first face then the central plane. In addition, the density of the nucleation centers increases from the first face to the region of maximum density and decreases from the region of maximum density to the central plane.

The present invention is also directed to a silicon wafer containing oxygen precipitates. The silicon wafer has a first face, a second face and a central plane equidistant between the first and second faces. The maximum density of the oxygen precipitates is in a region which is between the first face and the central plane and nearer to the first face then the central plane. In addition, the density of the oxygen precipitates increases from the first face to the region of maximum density and decreases from the region of maximum density to the central plane.

Further particularities and advantages of the present invention will turn out to be evident from the continuation of the disclosure with reference to the figures given only as a matter of explanation and not of limitation.

BRIEF DESCRIPTION OF THE DRAWINGS

FIG. 3 shows the profile of the density of the precipitates as a function of the depth for one of the two wafers sobjected in a coupled form to the treatment according to the present invention.

DESCRIPTION OF THE PREFERRED EMBODIMENTS

Before passing to a detailed description of the single stages of the process, it is desired to precisely state that the present invention has started from the observation that subjecting the silicon wafers to a thermal rapid annealing treatment at a high temperature, in particular between 1200° C. and 1300° C., for short time intervals, a considerable improvement of oxygen precipitation is achieved. In particular, it has been observed that such an intensification depends on temperature and does not present itself homogeneous at the interior of the wafer. Under the latter aspect, the formation has been observed of two concentration peaks, in proximity to the two major surfaces of the wafers, with a minimum plateau in the central zone.

Figure 1:
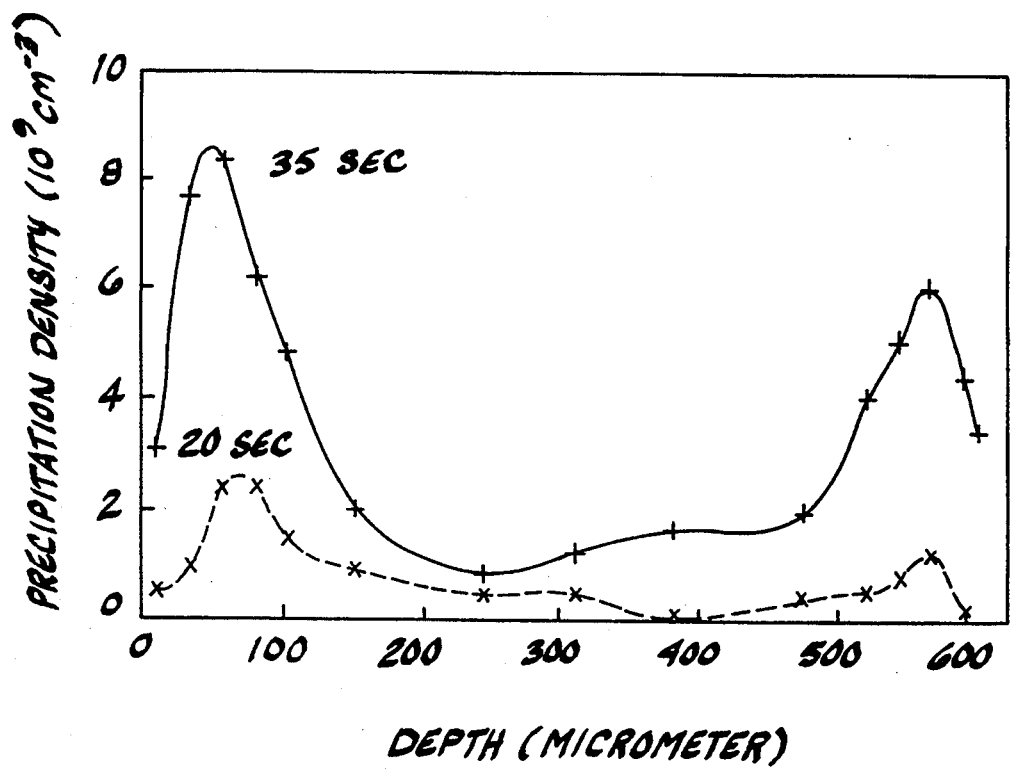
FIG. 1 shows a profile of the density of the precipitates as a function of the depth for a single silicon wafer heated to a temperature close to 1200° C. for two short, but distinct time intervals, of 20 and 35 seconds, respectively.

This is clearly put into evidence in FIG. 1, wherein the two peaks in proximity to the two major surfaces of the wafer and the central plateau are easily recognized. The diversity of the profile in correspondence to two different treatment durations (20 s and 35 s) is also recognized.

Under the physical aspect, it has been ascertained that this thermal rapid annealing treatment at a high temperature involves the formation of the so-called defects which act as precursors for the subsequent nucleation and growing of the precipitates of oxygen.

A further observation at the basis of the present invention is that a thermal treatment at temperatures of 900° to 1000° C. of the wafers already subjected to a rapid thermal annealing does not favour a further nucleation, and on the contrary it involves a dissolution of a certain fraction of the aforementioned precursors generated at a high temperature. Indeed, it has been proven that such precursors present a certain instability when they are cooled at temperatures lower than those at which they have been generated. As a compensation, this treatment at 900° to 1000° C. involves a growing of existing precipitation nuclei and a general stabilization of the defects created by the rapid thermal annealing treatment.

Finally, at the basis of the present invention there is the discovery that the instability of the precursors generated at a high temperature can be put into so a close relationship with the cooling conditions, that it is hypothesized that a temperature gradient at the interior of the wafer during the cooling can involve a disuniformity of the dissolution of the defects at a high temperature. This hypothesis could explain the difference of the peak values of the density of the two different surfaces which have different emissivity values as a consequence of one of the surfaces being polished and the other being rough. It has been demonstrated that the peak corresponding to a surface is substantially eliminated when the thermal emissivity through such a surface is greatly reduced and therefore the cooling of the wafer is greatly slowed down for instance by means of a thermal shielding of the surface itself.

Figure 2:
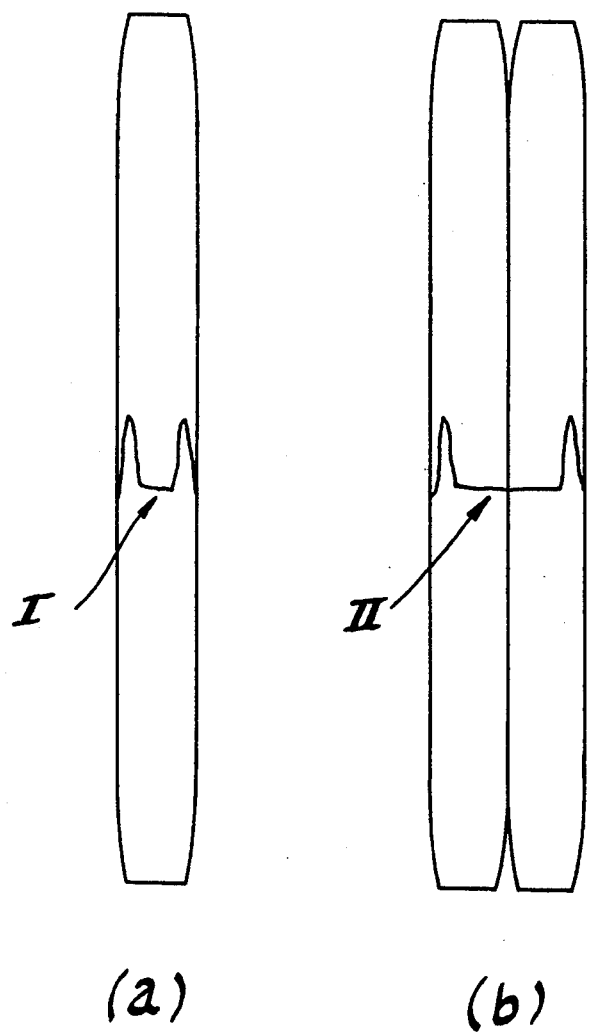
FIGS. 2a and 2b comparisonwise show the case of the treatment of a single wafer and the case of the treatment of a pair of coupled wafers according to the present invention.

With this very important consideration one of the fundamental characteristics is connected of the present invention, which consists in the fact that the wafers are not subjected to the treatment singularly, but physically coupled or paired into a close contact thereby to achieve their reciprocal thermal shielding. In this way, what is the double peak distribution profile of the defects indicated by the arrow of FIG. 2a, in which a single wafer is exposed, remains always a double peak profile as shown with the arrow II in FIG. 2b, but such a profile interests this time two paired wafers which, once separated, will have a defect density profile that presents a peak in proximity to a surface and a plateau near zero in proximity to the other surface. It is just the result that one desires to achieve, without having to resort to long and laborious complex thermal treatments for creating a good denuded zone suitable for the subsequent realization of integrated circuits.

In FIG. 3 the density profiles of the oxygen precipitates are reported more precisely as a function of depth, for a wafer treated under a form paired with another wafer, in the case of two temperatures of 1200° C. and of 1250° C.

Synthesizing the observations set forth above, the process according to the present invention fundamentally comprises the following treatment operations.

In a second operation the wafers, after having undergone a standard etching treatment, are subjected two by two in a close reciprocal contact to a rapid thermal annealing treatment in which they receive a thermal pulse of the duration of some tens of seconds, at a temperature approximately between 1200° C. and 1275° C. As the density of defects that are generated depends on both time and temperature, as already put into evidence in FIGS. 1 and 3, these parameters depend on the density of the defects that one desires to achieve.

To this operation a further thermal treatment follows at a temperature between 950° C. and 1150° C., eventually subdivided into two stages (for instance a first stage at 900° C. and a second stage at 1000° C., for time intervals of 4 hours and of 16 hours respectively). The aim of this operation is to stabilize and to grow the precipitation precursors that have been generated in the preceding operation, eliminating at the same time their unstable fraction.

In the subsequent operation the wafers are removed from the furnace and the surfaces that were in a close reciprocal contact during the high temperature thermal rapid annealing treatment are polished in a standard way. In this way, the peak-plateau profile created in the two preceding operations ensures that there is a very low defect density (plateau) in proximity to the polished surface, so realizing a denuded zone perfectly suitable for the fabrication of integrated circuits, and a high and well controlled defect density in proximity to the rear surface of the wafer, far from the active region, perfectly suitable for the desired function of trapping the contamination agents.

Within the frame of the present invention it has been, moreover, ascertained that the form of the precipitation profile is at least affected, if not determined, by the presence of a gaseous atmosphere on the slices, in particular nitrogen.

Therefore, the profile asymmetry that is obtained shielding a face of silicon is also due to the fact that the slice is shielded against the nitrogen atmosphere.

It is, moreover, desired to precisely state that it is not necessary that the shielding is realized by means of the coupling of slices as the same effect can be obtained with another shielding member, e.g. a quartz plate.

It is even foreseen that the asymmetry of the profile is at least favoured, if not promoted, by a double gaseous atmosphere, of argon on a face and of nitrogen on the other face of the slice.

We claim:

1. A silicon wafer containing oxygen precipitate nucleation centers and having a first face, a second face, and a central plane equidistant between the first and second faces, the nucleation centers having a non-uniform distribution between the first and second faces with a maximum density of the nucleation centers being in a region which is between the first face and the central plane and nearer to the first face than the central plane, the density of the nucleation centers increasing from the first face to the region of maximum density and decreasing from the region of maximum density to the central plane.

2. The silicon wafer of claim 1 wherein the second face of the wafer is polished.

3. A silicon wafer containing oxygen precipitates, the oxygen precipitates and having a first face, a second face, and a central plane equidistant between the first and second faces, the oxygen precipitates having a non-uniform distribution between the first and second faces with the maximum density of the oxygen precipitates being in a region which is between the first face and a central plane and nearer to the first face than the central plane, the density of the oxygen precipitates increasing from the first face to the region of maximum density and decreasing from the region of maximum density to the central plane.

4. The silicon wafer of claim 3 wherein the maximum density of oxygen precipitates is less than $2 \times 10^{10}$ precipitates per cubic centimeter.

5. The silicon wafer of claim 3 wherein the maximum density of oxygen precipitates is less than $1 \times 10^{10}$ precipitates per cubic centimeter.

6. The silicon wafer of claim 3 wherein the second face of the wafer is polished.

* * * * *